US006811611B2

(12) United States Patent
Johnson

(10) Patent No.: US 6,811,611 B2
(45) Date of Patent: Nov. 2, 2004

(54) ESRF SOURCE FOR ION PLATING EPITAXIAL DEPOSITION

(75) Inventor: Wayne L. Johnson, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/204,002
(22) PCT Filed: Mar. 2, 2001
(86) PCT No.: PCT/US01/06793

§ 371 (c)(1),
(2), (4) Date: Aug. 16, 2002

(87) PCT Pub. No.: WO01/65590

PCT Pub. Date: Sep. 7, 2001

(65) Prior Publication Data

US 2003/0056716 A1 Mar. 27, 2003

Related U.S. Application Data

(60) Provisional application No. 60/186,331, filed on Mar. 2, 2000.

(51) Int. Cl.$^7$ ............................................. C30B 25/06
(52) U.S. Cl. ............................ 117/92; 117/93; 117/103; 117/108

(58) Field of Search .............................. 117/92, 49, 103, 117/168

(56) References Cited

U.S. PATENT DOCUMENTS

| 5,302,237 | A | | 4/1994 | Larson et al. |
| 5,903,106 | A | | 5/1999 | Young et al. |
| 5,948,215 | A | | 9/1999 | Lantsman |
| 6,117,279 | A | | 9/2000 | Smolanoff et al. |
| 6,190,513 | B1 | | 2/2001 | Forster et al. |
| 6,385,977 | B1 | * | 5/2002 | Johnson .......................... 62/64 |
| 6,425,953 | B1 | * | 7/2002 | Johnson .......................... 134/1 |
| 6,491,742 | B1 | * | 12/2002 | Johnson ....................... 95/266 |
| 6,530,342 | B1 | * | 3/2003 | Johnson ....................... 118/231 |

* cited by examiner

Primary Examiner—Robert Kunemund
(74) Attorney, Agent, or Firm—Oblon, Spivak, McClelland, Maier & Neustadt, P.C.

(57) ABSTRACT

A method and system for growing a crystalline layer on a substrate. Using an electrically-shielded RF (ESRF) source, a plasma is created and directed to a substrate inside the ESRF source. The plasma arrives at the substrate surface with a high mobility and enables its constituents to form a highly regular structure on the substrates.

11 Claims, 2 Drawing Sheets

ESRF SOURCE FOR ION PLATING EPITAXIAL DEPOSITION

This application is a 371 of PCT/US01/06793 filed Mar. 2, 2001 which claims benefit of 60/186,331 filed on Mar. 2, 2000.

BACKGROUND OF THE INVENTION

1 Field of the Invention

The present invention is directed to a method and system for growing highly regular crystalline structures using an electrically shielded radio frequency (ESRF) plasma source.

2 Discussion of the Background

Monocrystalline layers of silicon have been grown on silicon substrates using several techniques, including liquid phase epitaxy, vapor phase epitaxy, molecular beam epitaxy, and ion plating. The goal of epitaxial growth is to produce a grown layer that replicates the crystalline structure of the substrate on which it has grown. In addition, with regard to certain kinds of defects, an epitaxially grown layer is typically more nearly defect-free than the substrate on which it grew. Chapter 7 of *Semiconductor integrated circuit processing technology*, Addison-Wesley Publishing Company, Inc., Reading, Mass., 1990, by W. R. Runyan and K. E. Bean, describes epitaxy.

High resistivity layers grown epitaxially on low resistivity substrates are used to reduce the base-collector resistance and thereby increase the performance of bipolar transistors. Although transistors fabricated in MOS integrated circuits are self-isolating, higher performance and/or smaller circuit size is often possible if epitaxial techniques are incorporated in the circuit design. Consequently, epitaxial growth technology remains an important technique among the tools available to the designer of integrated circuits.

An important application of vapor phase epitaxy is the growth of high resistivity layers on low resistivity substrates. Whenever doping is achieved using either solid-state diffusion or ion implantation, the dopant is introduced from the surface; so the dopant concentration near the surface is generally greater than the dopant concentration deep inside the wafer. During growth from a melt, after a dopant has been added to the melt, it cannot, in practice, be removed; so during growth from a melt the impurity concentration may be abruptly increased, but not decreased. On the other hand, in vapor phase epitaxial growth, the dopant is deposited simultaneously with the host semiconductor (e.g., silicon), and its concentration in the epitaxially growing layer may be readily decreased or increased. Furthermore, the species of dopant can also be readily changed. Therefore, using vapor phase epitaxy, one can, in principle, sequentially grow on the same substrate uncompensated layers of p-type and n-type material having widely different resistivities.

The epitaxial layer can grow defect-free only if no solid material is formed in the gas adjacent to surface of the growing layer. That is, if a solid forming chemical reaction is involved, that reaction must be surface catalyzed. If no solid forming chemical reaction is involved, steps must be taken to insure that no groups of atoms or molecules form prior to their impinging on the growing layer.

It is known from nucleation theory that nucleation is favored at steps or ledges on a growing surface. Indeed, in many cases the observed growth rates can be explained only if a continuous supply of ledges or steps is assumed. Nevertheless, the atoms that strike the surface of the growing layer do not all suffer the same fate. Five possibilities may be identified:

1. After striking the surface, the atom may be desorbed before it becomes incorporated in the growing layer.
2. If the surface mobility of the atom is very small or if the deposition rate is very high, the atom may be surrounded by other atoms and effectively be trapped at a location that is not coincident with an appropriate crystallographic site. In such a case, a polycrystalline or amorphous layer will result.
3. If the surface mobility of the atom is great enough to permit it to move appreciably across the surface but the ledges are widely separated, it may, before reaching a ledge, join with other atoms on a terrace (i.e., a flat surface between ledges or steps) to form a stable and perhaps even properly oriented cluster that can serve as a nucleating ledge for subsequently arriving atoms.
4. If the surface mobility of the atom is great enough to permit it to move appreciably across the surface, it may diffuse to a ledge, bond properly at an appropriate crystallographic site, and thereby become a proper component of the epitaxially growing layer. For silicon and other crystalline materials characterized by the diamond lattice, a sufficient number of atomic bonds are available at a ledge or step on any crystalline surface to orient properly and bond stably any atom that diffuses to it. Ledges are most important when the depositing species is chemically hindered from forming a solid. These species have two surfaces at the ledge to remove the partially bonded atoms from the crystal forming species.
5. The atom may bond properly at an appropriate crystallographic site without having diffused to a ledge or having joined with other atoms.

In possibilities 2 through 5, the atom becomes incorporated in the growing layer and is therefore referred to as an adatom. This brief description of the several ways in which an adatom may be incorporated into the growing layer suggests that the mechanism by which such incorporation occurs will depend in a significant way upon the energy of the impinging atom. To facilitate the incorporation of adatoms at proper lattice sites, temperatures in the range from 950° C. to 1150° C. are usually used for the epitaxial growth of silicon on silicon. For temperatures in this range, growth rates of the order of a micrometer per minute are achieved. As the growth temperature is increased, the maximum growth rate at which a certain quality of epitaxial growth (as determined, perhaps, by defect density) can be achieved is also increased.

Interest in lower temperature procedures continues because lower processing temperatures minimize both slip defects and impurity and dopant redistribution by diffusion. Conventional epitaxial reactors have been used at temperatures in the range from 800° C. to 1200° C. Process temperatures in the range from 600° C. to 800° C. are possible using molecular beam epitaxy (MBE).

Another factor that greatly influences the quality of an epitaxially grown layer is the condition of the substrate surface. To prevent defects, such as undesired polycrystalline growth and stacking faults, from originating at the interface between the substrate and the growing layer, the substrate surface must be both damage-free and clean. Residual damage from mechanical polishing operations must be removed. One procedure for removing the damaged layer uses high-temperature HCl vapor phase etching. Standard surface preparation techniques such as the so-called "RCA Cleanup," satisfactorily remove most contaminants that adversely affect subsequent epitaxial growth. However, the thin layer of oxide that remains after chemical etching, and residual carbon from adsorbed organic solvents (if epitaxial growth occurs at relatively low substrate temperatures), and any heavy metal contaminants must also be removed. The major problem, however, is the removal of the residual oxide.

Surface cleaning may also be affected with low-energy ions of an inert gas produced in a plasma. Argon is most commonly used, because it is the least expensive inert gas and the ions are heavy enough to have high sputtering yield cross-sections on most materials. For this purpose, an inductively-coupled plasma generator is especially well-suited, because it permits independent control of both plasma density and, using the independently controlled substrate bias, the energy of the impinging ions.

Finally, in cases where thermal decomposition of a silicon containing compound (e.g., $SiHCl_3$) at the growing surface is used, other products of the reaction (e.g., chlorine) may be incorporated in the growing film and adversely affect its quality.

Various techniques for achieving single-crystal epitaxial growth of silicon on silicon have been described in the non-patent and patent archival literature. U.S. Pat. No. 3,379,584, to Bean and Runyan, entitled "Semiconductor wafer with at least one epitaxial layer and methods for making same" (hereinafter "the '584 patent") describes the formation of a monocrystalline silicon epitaxial layer on a silicon substrate using thermal decomposition of silicon tetrachloride contained in a hydrogen carrier gas that also contains a small amount of antimony tetrachloride or some other suitable n-type dopant. The '584 patent cites H. C. Theurer, "Epitaxial silicon films by hydrogen reduction of $SiCl_4$," *J. Electrochemical Society*, Vol. 108, pp. 649–653 (1961); and H. Christiansen and G. K. Teal, U.S. Pat. No. 2,692,839. Christiansen and Teal describe the application of vapor phase growth of germanium and silicon to the fabrication of semiconductor devices. From about 1960, the non-patent archival literature has included many articles on epitaxy. See, for example, H. C. Theurer, "Epitaxial diffused transistor," *Proc. IRE*, Vol. 48, pp. 1642–1643, 1960.

Vacuum evaporation of silicon was described in "Epitaxial growth of silicon by vacuum evaporation," *Nature*, Vol. 194, pp. 966–967, 1962, by B. A. Unvala. In 1966, the term molecular beam epitaxy (MBE) came into use. See B. A. Joyce and R. R. Bradley, "A study of nucleation in chemically grown epitaxial silicon films using molecular beam techniques," *Phil. Mag., Series* 8, Vol. 14, pp. 289–299, 1966. The layers produced in early MBE experiments were of relatively poor quality due to contaminants incorporated in the growing layers. As vacuum systems improved (and became much more expensive), the quality of MBE-grown layers improved as well. However, for most purposes, MBE does not compete with other techniques for epitaxial growth. It does have advantages for special situations, however: (a) High-quality epitaxial layers can be grown at temperatures as low as a few hundreds of ° C. (b) Rapid changes in dopant concentration are possible. (c) It is well-suited for growing very thin epitaxial layers. (d) The low deposition temperature implies that the incorporation rate (the rate at which atoms can find a proper crystal site) is low, which limits the growth rate of the epitaxial layer.

Ion plating is especially notable and is described in U.S. Pat. No. 3,329,601 to D. M. Mattox, entitled "Apparatus for coating a cathodically biased substrate from plasma of ionized coating material," issued Jul. 4, 1967 (hereinafter "the '601 patent"). The technique described in the '601 patent includes making a substrate to be coated the cathode of a high-voltage DC circuit, establishing a gas discharge within an evacuated reaction chamber, and evaporating a metal to be deposited into the positive glow region of the gas discharge. The surface of the substrate may be exposed to the gas discharge prior to and during the evaporation and is thereby cleaned and may be modified by ionized particles of the gas discharge. Some of the atoms to be subsequently deposited are also ionized in the gas discharge and accelerated to the substrate surface, contributing with high energy inert gas ions, and uncharged metal atoms with thermal energies. This ion bombardment produces high apparent surface temperatures without the need of bulk heating. The combination of cleaning and high energy flux at the substrate surface during deposition is conducive to the deposition of adherent metallic films and by extension to the growth of epitaxial layers, with a low density of interface defects.

D. M. Mattox's paper entitled "Fundamentals of ion plating," J. Vac. Sci. Technol., Vol. 10, No. 1, pp. 47–52, January/February 1973 (hereinafter "Mattox") further describes ion plating and states that:

The term ion plating is applied to atomistic film deposition processes in which the substrate is subjected to a flux of high energy ions sufficient to cause appreciable sputtering before and during film formation. Ion plating is usually done in an inert gas discharge system similar to that used in sputter deposition except that the substrate is made a high voltage sputtering cathode. The substrate is subjected to inert gas ion bombardment for a time sufficient to remove surface contaminants and barrier layers (sputter cleaning) prior to deposition of the film material. After the substrate surface is sputter cleaned the film deposition is begun without interrupting the ion bombardment. For a film to form it is necessary for the deposition rate to exceed the sputtering rate. Ion bombardment may or may not be continued after the interfacial region has been formed.

Mattox's FIG. 3 shows a simple ion plating setup; other figures in Mattox's U.S. Pat. No. 3,329,601 are similar. A continuously pumped vacuum system capable of attaining pressures in the $10^{-7}$ Torr is used. The surface to be coated serves as the cathode of a diode type DC discharge; the metal deposition source, which may be a resistively heated evaporation boat, is the anode. A high-voltage DC power supply, similar to those normally used for sputtering, is used for ion plating. The gas pressure is controlled using a gas inlet with a variable leak.

Gerald W. White in U.S. Pat. No. Re. 30,401: "Gasless ion source," issued Sep. 9, 1980 (a reissue of U.S. Pat. No. 4,039,416), includes an RF field in his ion plating apparatus and also introduces the term "gasless." Re 30,401 states that:

A gasless ion plating process wherein plating material is melted, vaporized, and then subjected to an ionization environment in a low pressure chamber with a "virtual cathode" consisting of a plasma of ionized atoms of evaporant material created by evaporating in an RF field. It is a gasless ion plating process wherein the system ambient pressure prior to plating material evaporation may be much lower than that required to sustain a glow discharge, however, with vapor pressure of evaporant material added to the environment base pressure being such as to result in a plasma of ionized atoms of the plating material developing as the vaporized material approaches the RF cathode.

Gerald W. White and Jack C. Volkers describe in U.S. Pat. No. 4,342,631: "Gasless ion plating process and apparatus," issued Aug. 3, 1982, a gasless ion plating apparatus that employs RF energy.

In accordance with a disclosed embodiment, one or more substrates to be plated are placed within the chamber. Also within the chamber there is disposed a plating source which includes plating material. The chamber is evacuated and the plating material is heated to evaporate the plating material. Radio frequency energy is applied to the plating source to form a plasma of positively charged plating ions from the vaporized plating material. A positive direct current bias is developed on the plating source relative to the substrates by, for example, applying a direct current positive voltage to the plating source to create an electrical field between the source and substrates for accelerating the plating ions towards the substrates for plating same.

The White patents describe an RF plasma apparatus that is essentially a capacitively-coupled plasma generator. However, neither Mattox (U.S. Pat. No. 3,329,601), White (U.S. Pat. No Re. 30,401), nor White and Volkers (U.S. Pat. No. 4,342,631) discusses the production of epitaxial single-crystal layers.

SUMMARY OF THE INVENTION

It is an object of the present invention to provide an improved growth technique as compared to the prior art. Measures of value for a particular epitaxial growth technique include, but may not be limited to: (a) defect density and doping uniformity in the epitaxial layer, (b) throughput or deposition rate, (c) ability to change dopants and/or dopant concentration rapidly as growth proceeds or between runs, (d) potential capability of process and equipment to be adapted to production of larger wafers, and (e) cost per wafer. The present invention provides advantageous results for criteria (a)–(d), and may also represent an improvement with regard to criteria (e).

It is another object of the present invention to grow epitaxial single crystalline layers (e.g., silicon layers) on a substrate (e.g., a silicon substrate) in an ESRF source using the techniques of gasless ion plating since the low energy of the impinging ions/atoms does not cause appreciable damage to either the substrate or the growing layer.

The above objects and other advantages of the present invention are made possible by: a process chamber and an associated vacuum pumping system capable of maintaining a pressure of 1 m Torr or less in the chamber during the epitaxial growth of an atomic or molecular layer on a substrate; an evaporation source capable of producing the atomic or molecular vapor; a source of an inert gas and an adjustable valve through which the inert gas may be admitted to the process chamber; an electrically shielded radio frequency (ESRF) plasma source having wall-bias capability; and a substrate support (chuck) with an extremely low radio frequency (RF) impedance drive system.

BRIEF DESCRIPTION OF THE DRAWING

A more complete appreciation of the invention and many of the attendant advantages thereof will become readily apparent with reference to the following detailed description, particularly when considered in conjunction with the accompanying drawings, in which.

DETAILED DESCRIPTION OF THE PREFERRED EMBODIMENTS

Figure 1:
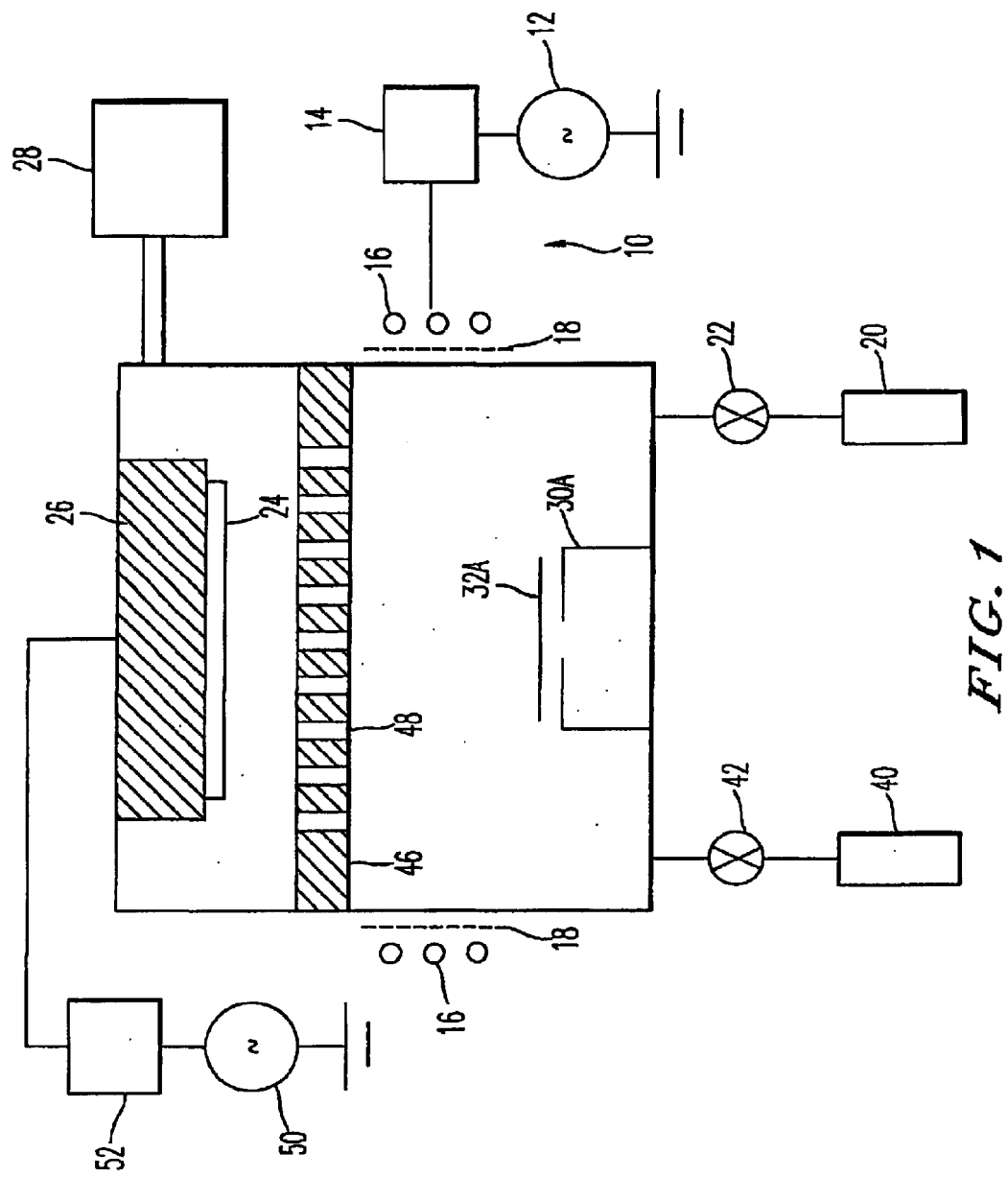
FIG. 1 is a schematic illustration of an epitaxial growth system according to the present invention.

Turning now to the drawings, in which like reference numerals designate identical or corresponding parts throughout the several views, FIG. 1 is a schematic illustration of an epitaxial growth system according to the present invention. Prior to placing a substrate 24, on which an epitaxial layer is to be grown, onto the substrate holder 26 of the system of the present invention, the substrate may need to be cleaned. Substrate holder 26 includes, preferably, means for controlling the temperature of substrate 24 (e.g., a resistive heater) and means for clamping the substrate 24 to the substrate holder 26 (e.g., an electrostatic chuck). The preparatory cleaning may be satisfactorily accomplished by using the so-called "RCA Cleanup" (or some variation thereof), as described herein above. After the substrate has been mounted on the substrate holder, an inert gas (e.g., argon) is typically admitted to the process chamber 5 and the ESRF plasma source 10 comprising an RF power source 12, a matching network 14, an induction coil 16, and an electrostatic shield 18 is used to establish a plasma within the process chamber. Using well known techniques, any residual contaminants on the substrate surface (e.g., oxides of silicon) are removed by bombardment of the surface with low energy ions of the inert gas. The energy of the bombarding ions should be sufficiently small to minimize the creation of crystalline defects during the cleanup procedure (e.g., using energy not to exceed about 20 eV).

After surface contamination has been reduced to a satisfactory concentration, the flow of the inert gas from gas container 20 into the process chamber is stopped using the adjustable flow valve 22, and the remaining inert gas is removed from the process chamber. In the absence of inert gas flow into the process chamber, the vacuum pumping system 28 should be capable of attaining a pressure of 0.01 mTorr. When a suitable pressure has been attained, epitaxial growth of an atomic or molecular layer may be initiated. The virtual absence of inert gas in the chamber at this stage of the process ensures that virtually no inert gas will be incorporated in the epitaxial interface layer to be grown.

In the preferred embodiment, an electron beam in electron beam evaporator 30A is used to bombard a solid atomic target (e.g., a solid silicon target), and thereby to heat the atomic target in the immediate proximity of the impact area of the electron beam to such an extent that liquid and vapor are produced. Although the target may be placed in a container of a different material, such a container is not necessary, because the trajectory of the electron beam may be carefully controlled. Electron beam evaporator 30A includes a movable shutter 32A that provides a means to control the egress of evaporated material from electron beam evaporator 30A.

When the pressure due to the vapor attains the desired value of approximately 1 mTorr, the ESRF plasma source is used to establish a plasma. Preferably the ESRF source is configured to have a high Q to operate at pressures below one mTorr and to operate at a high power density (e.g., greater than 5 W/cm$^3$). The process chamber also is configured so that the substrate is immersed in the plasma. A suitable RF bias is applied to the substrate chuck 26 and epitaxial growth of silicon on the silicon substrate 24 is initiated. After the epitaxial layer attains the desired thickness the process is terminated and the substrate 24 is removed from the process chamber 5.

Other atomic targets besides silicon also are possible. Moreover, molecular targets, molecular gas mixtures and molecular precursors are also possible. In one embodiment, evaporated Si is combined in a plasma source with $O_2$ to grow $SiO_2$ (i.e., glass). In yet another embodiment, it is possible to react an atomic surface with a molecular precursor. In one such embodiment, $CF_4$ is used in a plasma as a precursor to Teflon® and $F_2$ is added to the surface as part of the accelerated species. Gases may be reacted continuously or sequentially to produce a layer comprising a single chemical compound or a plurality of layers of materials comprising different chemical compounds with excellent control of the stoichiometry of the deposited layer or layers.

Figure 2:
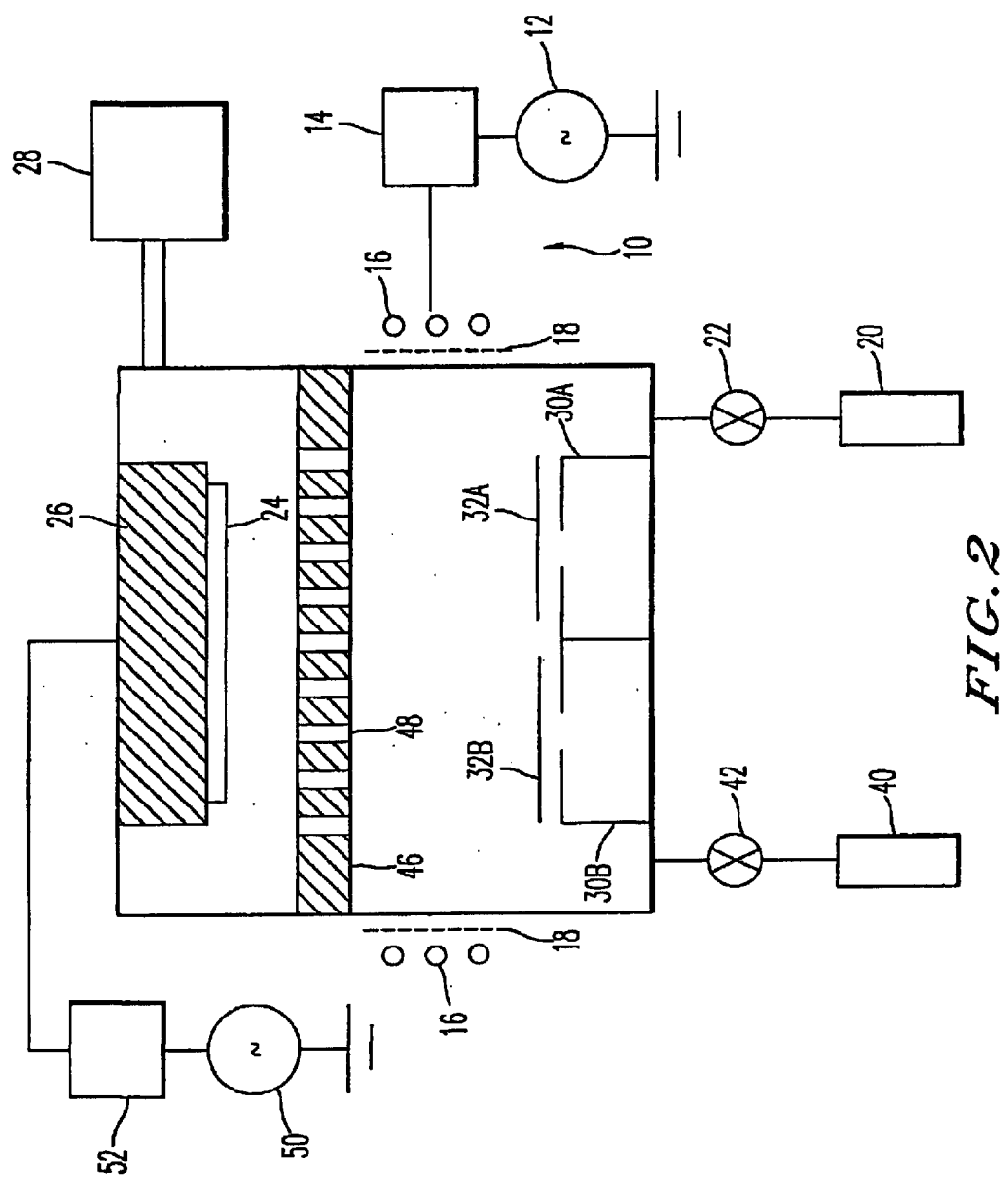
FIG. 2 is an alternative schematic illustration of an epitaxial growth system according to the present invention.

In yet another embodiment, as shown in FIG. 2, a plurality of plasmas can be generated within the same chamber from different targets or sources that are independently controlled. FIG. 2 differs from FIG. 1 only in that a second electron beam evaporation source 30B (with a corresponding shutter 32B) has been added. Although only two electron beam evaporation sources 30A and 30B are shown, more than two sources may be used. Using this technique, the ions (or neutrals) of the plural plasmas can be controlled to have different ionization energies as they arrive at the substrate surface. Using this technique, many ions (or neutrals) can be combined in order to form very complex molecular structures (e.g., superconducting structures).

Several structures comprising a plurality of thin layers of different atoms and/or molecules are of interest to the semiconductor industry. For example, one application comprises strained-layer-superlattices. In particular, very thin layers of germanium (Ge) and silicon (Si) are sequentially deposited. Ultimately, a gallium indium phosphide arsenide (GaInPAs) system, which is useful for optical emitters and receivers having high-frequency modulation capabilities, is deposited. This growth technique permits Si devices and GaInASP structures to be grown on the same substrate and to be interconnected by conventional semiconductor traces.

The technique described herein is also not limited to solid targets for generating vapor. Instead, gases (atomic or molecular) can be introduced into the ESRF system directly to form a desired plasma. Depending on processing conditions, the gas can be admitted either through the top or the side of the process chamber 5 from a gas container 40 by means of a flow valve 42. The technique is also not limited to using a single source during a growth cycle. Since the impurity (doping) concentration of the epitaxially grown layer depends on the impurity concentration of the source, multiple sources can be used to permit changes in impurity concentration over very short distances in the epitaxial layer as the growth proceeds. For example, plural solid sources on a carousel which can be rotated in situ are used in one embodiment. Multiple electron beam gun sources are commercially available: Temescal sells a three-source evaporator (their Trigon unit, part number 0317-7615-1). Metered flows of gases containing appropriate impurities are used instead in an alternate embodiment, but decomposition products of the source gases would, in general, be incorporated in the growing layer.

According to the present invention, ions pass through a collimator 46, which has cylindrical passages 48 through which the ions pass and are accelerated across the sheath of a plasma and impinge upon the surface of a substrate 24. The extent to which ion trajectories may depart from the direction normal to the substrate surface is limited by the ratio of the diameter of the cylindrical passages 48 to their length. Energy is delivered by those ions to the substrate at a rate not likely to exceed approximately 10 W/cm$^2$, which is sufficient to establish a substrate temperature in the range from less than 600 K to more than 1200 K, depending on the efficacy with which heat is removed from the substrate. The true substrate temperature may be maintained at a temperature sufficiently low to prevent the formation of defects such as slip defects. On the other hand, the true substrate temperature, in concert with the kinetic energy of the impinging adatoms, gives rise to a very high mobility of the adatoms, (i.e., atoms to be incorporated in the growing layer) on the surface. That high mobility can be interpreted in terms of an "apparent surface temperature" in the range from about 1500 K to 1900 K. Accordingly, this high apparent surface temperature and the high mobility of the adatoms facilitate the rapid epitaxial growth of layers with low defect densities.

Depending on the source, growth rates can vary significantly. For growing layers of silicon, growth rates on the order of 5 micrometers/min to 50 micrometers/min are expected.

In a preferred embodiment, the ESRF plasma source is compatible with a substrate 24 having a diameter in excess of 30 cm. Moreover, preferably the plasma density is approximately $5 \times 10^{13}$ cm$^{-3}$, which corresponds to a plasma ion flux of about 1 A/cm$^2$ and a surface power density at the substrate of about 10 W/cm$^2$ for a substrate bias voltage of about 9 V. The RF power supplied to the ESRF plasma source determines the plasma density. Therefore other plasma densities are possible. For a plasma density of approximately $1 \times 10^{13}$ cm$^{-3}$, the volume power density would be about 0.2 W/cm$^3$ and the surface power density would be about 2 W/cm$^2$.

In one embodiment, a substrate bias voltage (e.g., approximately 9 volts (i.e., the energy of the ions that impinge on the substrate is approximately 9 eV)) is applied to substrate chuck 26 through a variable- or fixed-voltage bias circuit 52. The RF power applied to the substrate chuck 26 by RF source 50 determines the substrate bias voltage. Accordingly, the ESRF plasma source permits independent control of the plasma density and the substrate bias voltage.

In yet another alternate embodiment, the ESRF plasma source has a wall-biasing circuit and bias shield (inserted between the electro-static shield and process tube) for preventing conducting deposits on the walls from extinguishing the inductively excited plasma. The wall biasing circuit can either prevent the formation of the deposits on the chamber walls or remove the deposits from the chamber walls after formation. Such a design for a bias shield is described in PCT/US98/23248. The contents of that application are incorporated herein by reference.

The substrate chuck 26 has an extremely low RF impedance of approximately 10 mΩ to 30 mΩ due to the shape of the feed structure that matches the impedance of the plasma. Such a design for the RF transmission feed is described in provisional application 60/182,188, filed on Feb. 14, 2000. The contents of that application are incorporated herein by reference. It is important to be sure the chamber is also capable of supporting this low impedance at the chuck drive frequency and the that drive frequency be high enough so that the motion of the ions is not significantly affected by the RF electric field (frequency>2 MHz for most ions). Additional details of such an RF Design can be found in PCT/US99/07962. The contents of that application are incorporated herein by reference.

Obviously, numerous modifications and variations of the present invention are possible in light of the above teachings. It is therefore to be understood that, within the scope of the appended claims, the invention may be practiced otherwise than as specifically described herein.

What is claimed is:

1. A method of growing a crystalline layer on a substrate inside an electrically shielded RF (ESRF) source, the method comprising the steps of:
   (a) ionizing a first gas inside the ESRF source;
   (b) directing the ionized first gas towards a substrate; and
   (c) growing, epitaxially, a single crystal layer on the substrate from the first gas.

2. The method according to claim 1, further comprising the step of injecting the first gas into the ESRF source from a gas source external to the ESRF source.

3. The method according to claim 2, wherein the step of injecting comprises injecting an atomic gas.

4. The method according to claim 2, wherein the step of injecting comprises injecting a molecular gas.

5. The method according to claim 1, further comprising the step of generating the first gas internal to the ESRF source by vaporizing a solid target.

6. The method according to claim 1, further comprising the step of generating the first gas as a time-varying gas by vaporizing plural solid targets internal to the ESRF source at different times during formation of the layer.

7. The method according to claim 1, further comprising the step of biasing the substrate to facilitate growing the crystalline layer.

8. The method according to claim 1, further comprising the steps of:
   ionizing a second gas; and
   directing the ionized second gas towards the substrate, wherein the step of growing comprises growing a single crystal layer using the first and second gases.

9. The method as claimed in claim 1, wherein steps (a) through (c) are performed in a plasma processing chamber.

10. The method as claimed in claim 1, further comprising, before step (b) the steps of:
    placing the substrate on a substrate holder; and
    biasing the substrate on the substrate holder.

11. The method as claimed in claim 1, wherein the step (c) is repeated to form a device having plural layers.

* * * * *